United States Patent [19]

Koontz

[11] Patent Number: 5,304,943
[45] Date of Patent: Apr. 19, 1994

[54] IN-PHASE COMBINER AND RF RECOVERY SYSTEM

[75] Inventor: Floyd A. Koontz, Holcomb, N.Y.

[73] Assignee: Harris Corporation, Melbourne, Fla.

[21] Appl. No.: 977,044

[22] Filed: Nov. 16, 1992

[51] Int. Cl.$^5$ .............................................. H03F 3/68
[52] U.S. Cl. ..................... 330/51; 330/124 R; 330/295; 330/297
[58] Field of Search ............... 330/10, 51, 124 R, 295, 330/297, 199, 202; 332/109, 115, 116, 149

[56] References Cited

U.S. PATENT DOCUMENTS 3,445,782  5/1969  Sonkin ............................. 330/124 R

FOREIGN PATENT DOCUMENTS 2525834  10/1983  France ................................. 330/295

Primary Examiner—James B. Mullins
Attorney, Agent, or Firm—Rogers & Killeen

[57] ABSTRACT

A system and method for combining RF signals by a series of in-phase combiners. The system uses a series of switched, high efficiency amplifiers which may be selectively operated to obtain a desired output signal, such as an Amplitude Modulated (AM) signal. The output signals of the amplifiers are combined by a series of in-phase combiners. In a high linearity system a feedback loop is used to correct for combiner losses. The RF power normally lost in the combiners is recovered and available to increase the overall combiner efficiency.

11 Claims, 4 Drawing Sheets

1

IN-PHASE COMBINER AND RF RECOVERY SYSTEM

BACKGROUND OF THE INVENTION

The present invention relates to radio frequency (RF) amplifiers and particularly to a system for amplifying high power RF signals and to recovering a portion of the signal power normally lost in prior art signal amplifying and combining systems.

Many current communication systems, whether they are used for transmitting analog data or digital data, employ high power RF amplifiers as part of the signal transmission or transponder sections of the system. Frequently, the information to be communicated by these systems is transmitted through the technique of amplitude modulation, AM. Usually, AM refers to full carrier amplitude modulation containing the information to be transmitted (and received) but it should be understood herein that any modulation system which causes the instantaneous composite amplitude of the waveform to be varied in accordance with the information transmitted may be termed an AM system. Single-sideband signals can also be generated by this system using the well known technique of envelope elimination and restoration (EER). Kahn, L. R.: "Single-Sideband Transmission by Envelope Elimination and Restoration", Proc. IRE, 1952, 40, pp. 803–806.

The AM signal to be broadcast may be generated in many ways. In one way, as disclosed in U.S. Pat. No. 4,580,111 to Swanson, an amplitude modulator generates an amplitude modulated carrier signal by selectively combining varying numbers of other carrier signals. Swanson also discloses a circuit which provides plural carrier signals of like frequency and phase where the number of carrier signals provided is dependent upon the number of digital levels chosen. Swanson uses a combiner made up of a plurality of transformers to combine the plural carrier signals and provide a combined signal which is the desired amplitude modulated carrier signal. Other combiner circuits are also disclosed by Swanson, including: voltage addition combiners, current addition combiners, and transmission line combiners. Various of Swanson's embodiments combine carrier signals which are equal in magnitude, carrier signals which are weighted in a binary progression, and, carrier signals which have been frequency modulated.

In another prior art system, disclosed in U.S. Pat. No. 4,804,931 to Hulick, the amplitude modulator comprises a predetermined number of quadrature power hybrid devices configured as combiners and arranged in cascade so that the output of one combiner becomes one of the inputs of its adjacent combiner. A digital decoder responsive to a digital input signal controlled the inputs ports of the combiners. By selectively enabling the RF signal to the various input ports the combined signal a the output of the last of the cascaded combiners represents the desired output signals, which my be fed to an antenna for transmission. The use of quadrature combiners in systems such as those disclosed by Hulick often are inefficient because of losses in the quadrature combiners. (Theoretically 50 percent of the power is lost at one-quarter power out.) For example, if the amplitude of the two signals appearing at the input ports to the combiners are not the same, the output signal will be less than the sum of the two input signals, the balance being reflected back and/or being absorbed by the resistor at the isolated port (i.e., a dummy or reject load). Such systems often have their best efficiency when all the input ports are loaded, a condition which occurs only at the maximum peak power output.

It is accordingly an object of the present invention to provide a novel digital amplitude modulator with improved power efficiency.

It is a further object of the present invention to provide a novel method and apparatus for combining in-phase RF signals.

It is yet another object of the present invention to provide an RF signal combiner in which the output signal tracks the input signal in a linear fashion.

It is still another object of the present invention to provide an RF signal combiner in which portions of the RF signal normally lost due to input signal mismatches can be recovered and used to reduce combiner power losses.

These and other objects of the present invention will become apparent to those skilled in the art from a review of the following specification in conjunction with the drawing figures when accorded a full range of equivalents.

BRIEF DESCRIPTIONS OF THE DRAWINGS

DETAILED DESCRIPTION OF THE PREFERRED EMBODIMENTS

Figure 1:
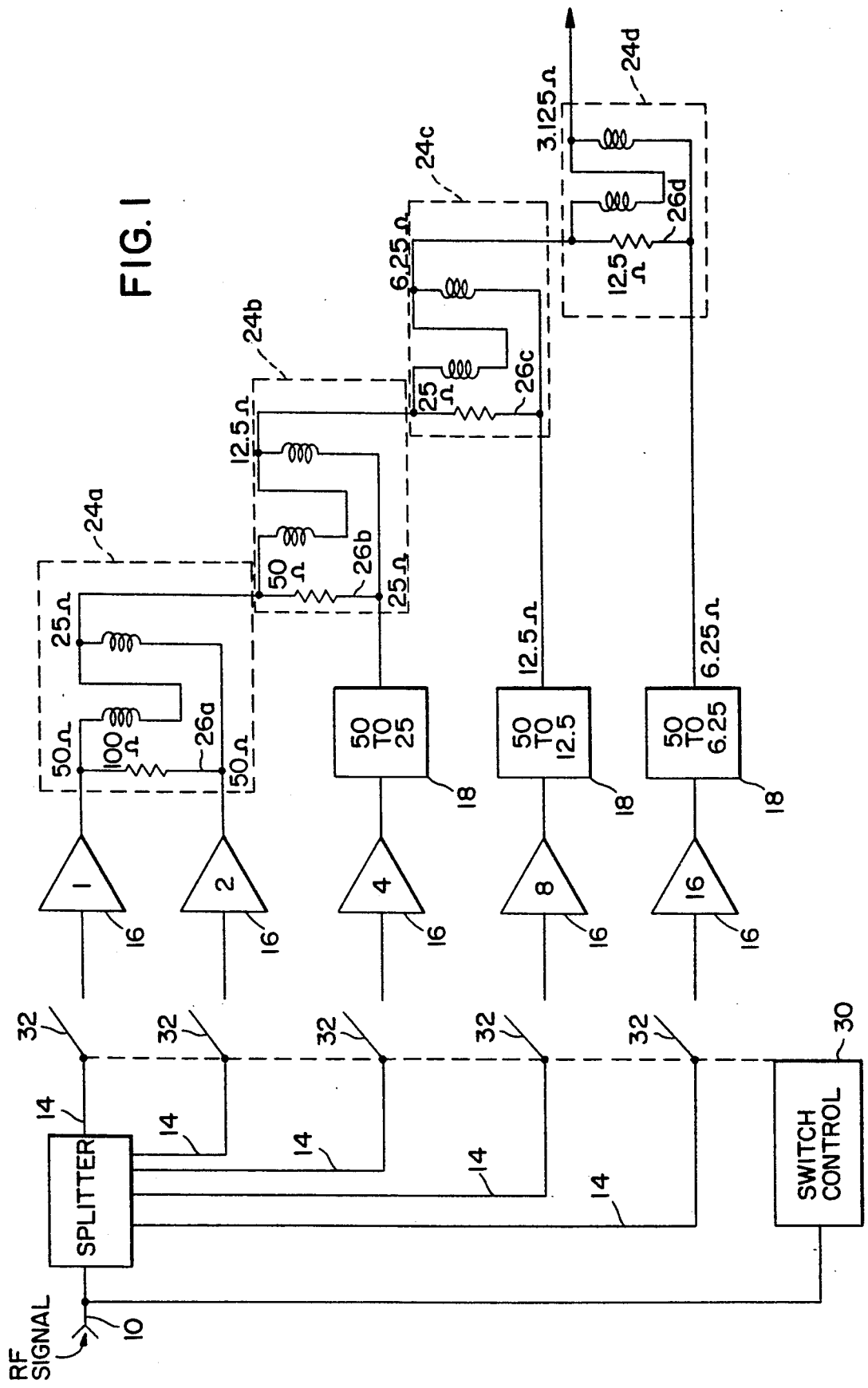
FIG. 1 is a functional block diagram of one embodiment of an in-phase combiner system in accordance with the present invention.

An amplitude modulator which contains an in-phase combiner in accordance with the present invention is shown in FIG. 1. The modulator receives an RF signal at its input port 10. The signal arriving at the input port 10 is provided as the input to a splitter 12 which produces in-phase signals 14 of equal amplitude. Each of the in-phase signals 14 is applied to one of plural linear amplifiers 16. The amplifiers 16 provide differing amounts of power, and would normally be set for binomial increasing output (1, 2, 4, 8, 16, etc.). The characteristic impedance of the signal output from the amplifiers 16 may be changed by impedance transformers 18. The signals output from the amplifiers 16 and the impedance transformers 18 are combined by a series of binary combiners 24. The signal output from the last of the series of combiners 24 is the output signal of the system.

As depicted in the system of FIG. 1, the transformation ratios of the impedance transformers and the resistance of the combiner resistor 26 are dependent on (a) the characteristic impedance of the signal received from the amplifiers 16 and (b) the location of the combiner 26a–26d within the series of combiners. As is well known, the impedance of the signal output by the binary combiner 24 is related to the impedance of the signals input to the combiner 24 and is one-half the impedance of the input signals if both input and signals have the same impedance. Thus, in a 50Ω characteristic impedance system, the output of the first combiner 24a will have a 25Ω impedance signals. Similarly, the third and fourth combiners operate on 12.5Ω and 6.25Ω signals, respectively.

The combiner resistor 26a-26d should similarly be selected with respect to the characteristic impedance of the signal output from the amplifiers 16 and the position of the combiner 24a-24d within the series of amplifiers 16. Preferably, the combiner resistors 26a-26d should have a resistance equal to the sum of the characteristic impedance of the signals across which the resistor 26 is placed.

The operation of the modulator of FIG. 1 is controlled by a switch control 30 which controls the operation of each of the switches 32. The switch control 30 switches the various amplifiers 16 in and out of operation in a digital manner so that after the output signals from the amplifiers 16 are combined, an analog signal related to the input signal in a desired manner can be obtained.

Alternatively to the input signal 10 and splitter 14, a system in accordance with the present invention could use an RF signal generator which provides multiple in-phase signals to the plural amplifiers 16. The switch control 30 can alternatively be made responsive to a digital or other signal representative of the desired output signal.

In operation, the plural in-phase RF signals are provided to the input ports of the plural amplifiers 16, each to receive sufficient drive level to saturate their output (high efficiency operation). Only the RF signals associated with switches 32 in the closed position are received by the amplifier 16. Thus, the level of the output signal from the system can be directly controlled by the switch control 30. After amplification, each of the input RF signal is combined with another RF signal in one of the in-phase combiners 24. To provide isolation between the input RF signals, each of the combiners 24 includes a combiner resistor 26 having an impedance which matches the combined impedance of the signals being combined. Because each of the combiners 24 reduces the impedance of its output signal to one-half that of the input signals, the signal applied to the series combiners may require transformation by the impedance transformers 18 so that the characteristic impedance of the two signals input are equal for each of the combiners.

Each of the switches 32, switch controls 30, amplifiers 16, impedance transformers 18 and in-phase combiners 24 may be conventional elements known to those skilled in the art of RF signal combiners.

Figure 2:
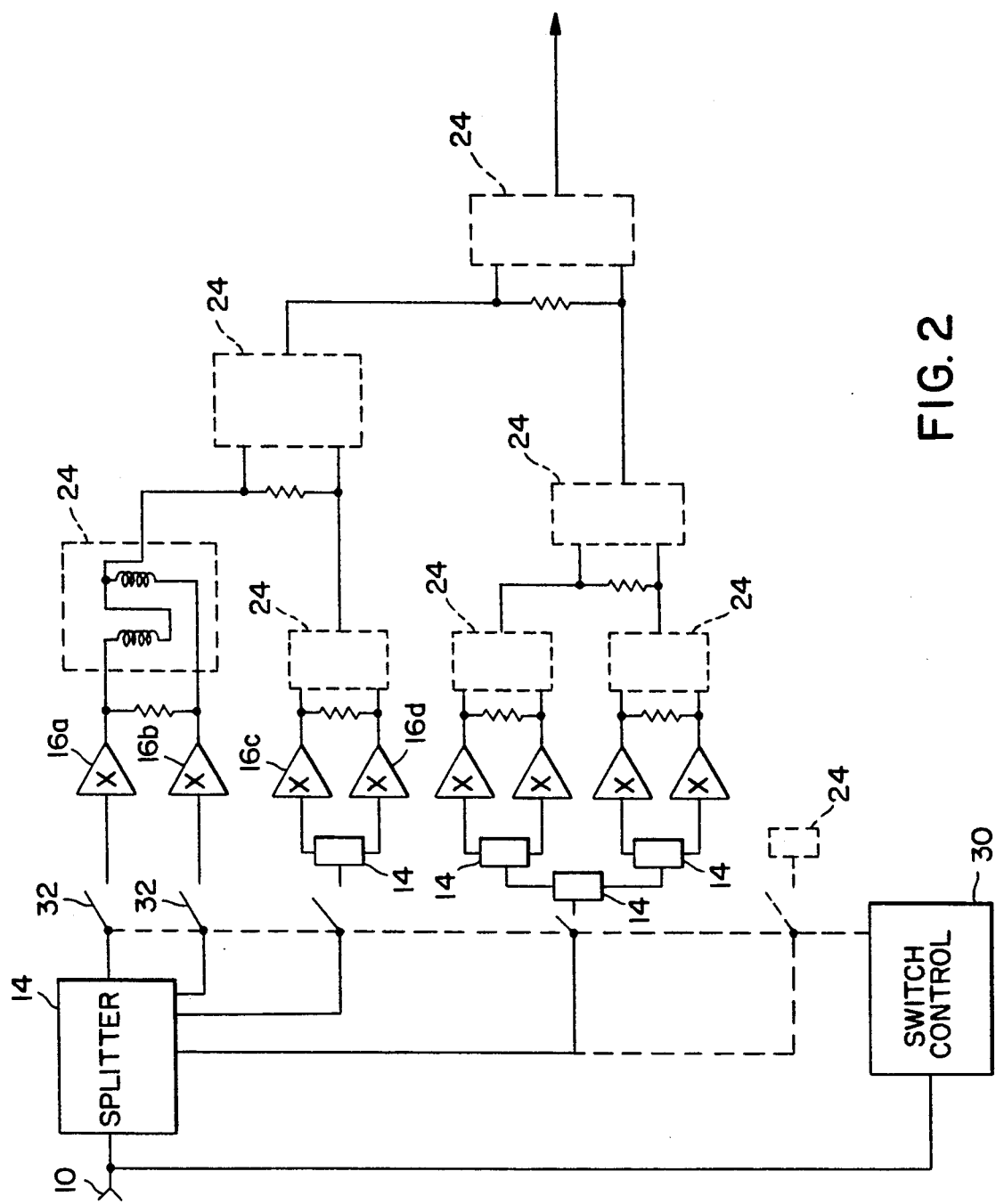
FIG. 2 is a functional block diagram of a second embodiment of an in-phase combiner system in accordance with the present invention.

With reference to FIG. 2, a second embodiment of the present invention may include a combiner in which all of the amplifiers are substantially identical, having a power output of X. In the system of FIG. 2, where similar elements to those appearing in FIG. 1 are given the same reference numeral, one RF input signal may be provided to an input port 10 and to a splitter 14 and a switch control 30. The splitter 30 splits the signal received at its input port into plural in-phase signals which are applied to plural switches 32. Under the control of the switch control 30, selected ones of the switches 32 operate to provide the in-phase signals to amplifiers 16 and/or to plural sub-splitters 14. The sub-splitters 14 split the received signal into two equal, in-phase signals which are either amplified by amplifiers 16c, 16d or are further split and then amplified. After amplification, the amplified signals are combined by one or more combiners 24 to generate a signal which is a $2^N X$ power. Thus, each of the signal paths through the switches 32 provides for a predetermined number ($2^N$) of driving signals. Subsequently, each of the paths of amplified signals is combined by a series of in phase combiners 24, connected as in the modulator of FIG. 1.

As will be appreciated by those skilled in the art, the modulator of FIG. 2 can operate in a fashion quite similar to the operation of the modulator of FIG. 1; however, the modulator of FIG. 2 utilizes substantially identical amplifiers and substantially reduces he need for impedance transformers. It will also be appreciated by those skilled in the art that a modulator in accordance with the present invention could use a combination of the amplification scheme of the modulators of FIG. 1 and FIG. 2.

Figure 3:
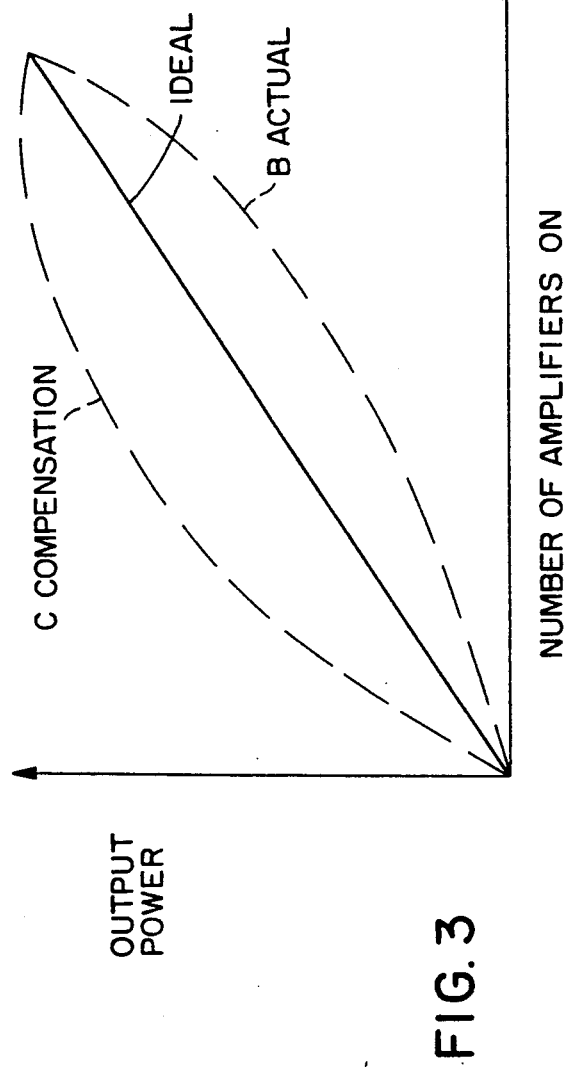
FIG. 3 is a chart illustrating the typical relationship between ideal output power and actual output power in a signal combiner system; and, FIG. 4 is a functional block diagram of an embodiment of a power recovery system which can be used with the present invention.

With reference to FIG. 1 and FIG. 3, if the circuit of FIG. 1 is used to combine signals without compensation, the in-phase combiners will introduce significant losses, just as the Hulick prior art, such that the output power is not a direct binary sum of the amplifiers activated. In an in-phase combiner, unless equal and same polarity signals are simultaneously applied in the combiner resistor 26, there is a significant loss across the resistor 26. For example, if the 8 and 16 power amplifiers are both on, there is no or minimal current flow through the combiner resistor 26d, and thus no power loss in this segment. However, if the 8 power amplifier is off and the 16 power amplifier is on, there is a 50% loss of power in the resistor With reference to FIG. 3, the graph depicts the relationship between ideal power output and actual power output as a function of the number of amplifiers turned on in a system. Note that if all of the amplifiers are turned on, there are no or minimal power losses in the combiner resistors, ignoring amplifier and other non-related losses. However, as some of the amplifiers are turned off, losses in the resistors will be experienced. (Curve B on FIG. 3) These losses are predictable, however, and the switch control 30 can be constructed to turn on additional amplifiers to compensate for the predicted losses. As depicted in FIG. 3, the switch control 30 can be constructed to compensate for the losses by following a compensation curve (such as curve C in FIG. 3) in determining how many and which amplifiers to switch into operation.

Figure 4:
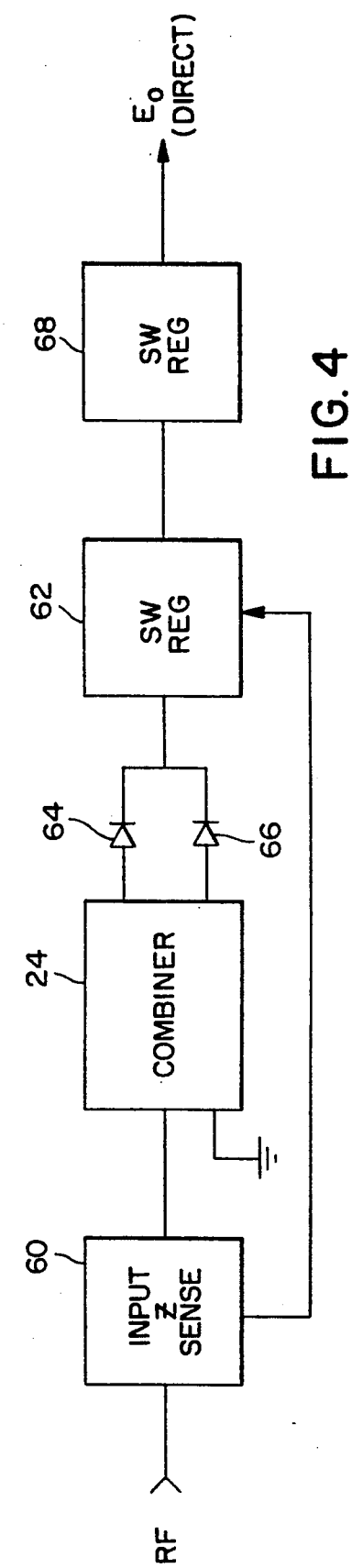

The compensation scheme described above linearizes the system of FIGS. 1 and 2; however, the efficiency of the system is compromised by the losses in the in-phase combiner resistors 24. With reference to FIG. 4, some of the power lost in the combiner resistors may be recovered by a recovery circuit. In this recovery circuit, the RF input signal is applied to a sense circuit 60 to sense the characteristic impedance of the rectifier/switching regulator. The sensed impedance is supplied to a controllable switching regulator 62 to control the input impedance. Two diodes 64, 66 are coupled to the combiners resistor 26 through an RF transformer. The output of signal from the first switching regulator 62 is applied to a second switching regulator 68 which supplies a constant output voltage that is applied to the system power supply.

In operation, the diodes 64, 66 rectify the RF signal developed across the combiner resistor 24 and apply the rectified signal to the controllable switching regulator 62. The controllable switching regulator 62 is controlled by the input impedance sensor 60 to maintain the input impedance to the transmitter constant. The output signal of the controllable switching regulator 68 to provide a constant voltage to the system power supply. Thus, the RF energy which otherwise would have been lost by the combiner resistor is converted to a direct current signal and fed back to the system power supply, thereby lowering the overall power consumption of the system. Efficiencies of this recovery circuit above 65 percent have been demonstrated.

Figure 5:
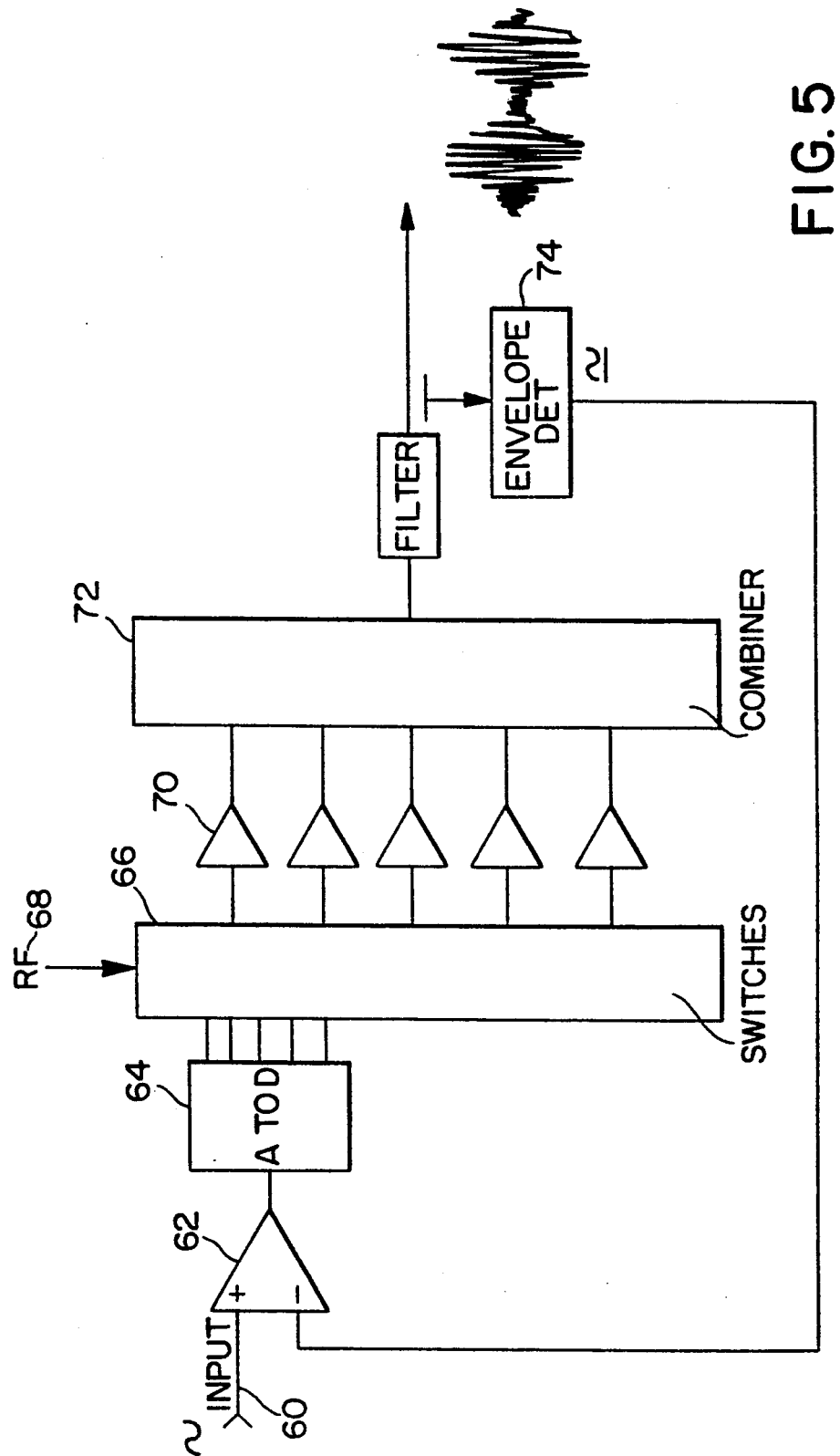
FIG. 5 is a functional block diagram of an embodiment of a high linearity system which can be used with the present invention.

With reference to FIG. 5, a system in accordance with the present invention can be constructed to operate with a relatively high degree of linearity. In such a system, an input signal 60 to be transmitted can be applied to one of the input terminals of a comparator 62. The output signal from the comparator 62 is applied to an analog to-digital circuit 64 which selectively operates plural switches 66 depending on the amplitude of the signal from the comparator 62. An RF signal 68 is applied through the switches 66 in a fashion similar to that used in the circuit of FIG. 1, energizing selected ones of plural amplifiers 70. The signals generated by the amplifiers 70 are combined by the combiner 72 as taught by the present invention. The output signal from the combiner 72 may be filtered and envelope detected by an envelope detector 74 whose output signal is applied to the other input of the comparator 62. In operation, the use of the envelope detector can compensate for the varying signal loss in the combiner 72 so that the input signal 60 is modified to maintain a linear amplification system.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A power amplifier of high frequency RF signals comprising:
    a signal splitter for splitting an input RF signal into plural RF signals related to the input RF signal;
    plural power amplifiers each of said amplifiers operatively connected to one of said plural RF signals through one of plural digitally controlled switches;
    control means for controlling the operation of said digitally controlled switches in relation to the power of the RF input signal;
    plural in-phase signal combiners, one of said combiners combining the signal output from two of the amplifiers and remaining said combiners combining the outputs of one of said amplifiers and one of said combiners to provide an amplified RF signal related to the input RF signal.

2. A system for amplifying high frequency RF signals, comprising:
    a signal splitter for splitting an input RF signal into plural RF signals related to the input RF signal;
    plural amplifying networks, each network operatively connected to one of said plural RF signals through one of plural digitally controlled switches;
    plural in-phase system combiners, one of said system combiners combing the signals from two of said amplifying networks and the remaining said combiners combining the signals from one of said amplifying networks and one of said combiners to provide an output RF signal; and
    switch control means to selectively provide one of the RF signals to each of the plural amplifying networks.

3. The system of claim 2 wherein said switch control means operates said digital switches so that the output RF signal is related to the input RF signal.

4. The system of claim 3 wherein said digital switches are operated in a binary manner to provide an output RF signal that is related to the binary sum of the amplifying networks activated.

5. The system of claim 2 wherein said system combiners comprise a transformer having two windings, each of the windings operatively connected to one of the signals being combined and a combiner resistor connected across the signals being combined.

6. The system of claim 5 with additional means for recovering a portion of the signal developed across the combiner resistor and returning it to the power supply of the system.

7. The system of claim 6 wherein the recovered and returned signal is developed by a power recovery system comprising:
    rectifying diodes operatively connected to the combiner resistor to rectify the signal developed across the combiner resistor;
    a first controllable switching regulator responsive to the impedance of the input signal and controlled to maintain constant the input impedance to the transmitter;
    a second controllable switching regulator operatively connected to the output signal from the first regulator to generate a relatively constant output power returned to the power supply of the system.

8. The system of claim 2 further comprising:
    digital logic means to determine the signal compensation required by the system to compensate for power losses therein;
    means for operating said switched control means responsively to the determined signal compensation.

9. The system of claim 2 wherein the output of at least one of said amplifying networks is connected to an impedance transformer.

10. The system of claim 2 wherein each of said amplifying networks comprises at least one amplifier and at least one signal splitter.

11. The system of claim 2 wherein said switch control means is responsive to said input RF signal.

* * * * *